(12) United States Patent
Lee et al.

(10) Patent No.: US 6,921,698 B2
(45) Date of Patent: Jul. 26, 2005

(54) THIN FILM TRANSISTOR AND FABRICATING METHOD THEREOF

(75) Inventors: Yu-Chou Lee, Taipei (TW); Wen-Kuang Tsao, Taoyuan (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 13 days.

(21) Appl. No.: 10/605,403

(22) Filed: Sep. 29, 2003

(65) Prior Publication Data
US 2005/0006645 A1 Jan. 13, 2005

(30) Foreign Application Priority Data
Jul. 11, 2003 (TW) .......................................... 92118974 A

(51) Int. Cl.$^7$ .............................................. H01L 29/76
(52) U.S. Cl. ...................... 438/270; 438/271; 438/587; 438/588
(58) Field of Search ................................ 438/270, 271, 438/587, 588; 257/59, 72, 347, 349–360

(56) References Cited

U.S. PATENT DOCUMENTS

| 6,323,521 B1 | * | 11/2001 | Seo | 257/347 |
| 6,396,106 B2 | * | 5/2002 | Kim et al. | 257/351 |
| 6,819,383 B2 | * | 11/2004 | Chae et al. | 349/140 |

* cited by examiner

Primary Examiner—Fetsum Abraham
(74) Attorney, Agent, or Firm—Jianq Chyun IP Office

(57) ABSTRACT

A method for fabricating a thin film transistor (TFT) is described. A MoNb gate is formed on a substrate, and an insulating layer is formed on the substrate covering the gate. A channel layer is formed on the insulating layer above the gate, and a source/drain is formed on the channel layer to constitute a TFT. Since the gate is constituted of a MoNb layer, the contact resistance thereof can be reduced.

12 Claims, 2 Drawing Sheets

THIN FILM TRANSISTOR AND FABRICATING METHOD THEREOF

CROSS REFERENCE TO RELATED APPLICATIONS

This application claims the priority benefit of Taiwan application serial no. 92118974, filed Jul. 11, 2003.

BACKGROUND OF INVENTION

1. Field of the Invention

The present invention relates to a semiconductor device and a method for fabricating the same. More particularly, the present invention relates to a structure of a thin film transistor (TFT) and a method for fabricating the same.

2. Description of the Related Art

A thin film transistor (TFT) typically includes a gate, a gate dielectric layer, a channel layer, a drain and a source, and is usually used as a switching device in a semiconductor apparatus. Since a TFT has a gate, a source and a drain, its operation is the same as that of a conventional MOS-FET. The TFT family includes amorphous silicon(□-Si) TFT, which is formed by sequentially forming a gate, a gate di-electric layer, an □-Si channel layer and a source/drain on a substrate. The gate is constituted of a single metal layer of aluminum (Al), chromium (Cr), tungsten (W), tantalum (Ta) or titanium (Ti), or constituted of multiple metal layers.

However, when a single layer of aluminum or aluminum alloy is used to form the gate, the surface of the layer easily reacts with oxygen in the atmosphere to form aluminum oxide that cannot be effectively etched in the subsequent etching process. Therefore, a protective layer, such as a nitride layer, is usually formed on an aluminum or Al-alloy gate to prevent formation of aluminum oxide. However, such a method causes etching residues to form around the top of the gate during the etching process, resulting in an eave effect that will affect subsequent processes.

On the other hand, when the gate is constituted of multiple metal layers including aluminum or aluminum alloy and other metals, such as chromium (Cr) or molybdenum (Mo), the underlying aluminum or Al-alloy layer having a higher etching rate is etched faster to produce undercuts in the etching process. Furthermore, etching residues are also formed during the etching process of the multiple metal layers, so that an eaves effect is caused to raise the contact resistance and the wire resistance of the gate and lower the performance of the device. In addition, the process for forming multiple metal layers is surely more complicated than that for forming a single metal layer. Moreover, the above problems also occur in the process for forming the source/drain.

SUMMARY OF INVENTION

In view of the foregoing, this invention provides a thin film transistor (TFT) that includes a gate or a source/drain having a lower contact resistance or wire resistance.

This invention also provides a method for fabricating a TFT that uses a material resistant to oxidation and erosion to form a single-layer gate or source/drain, so as to simplify the manufacturing process and improve the throughput.

This invention further provides a method for fabricating a TFT to prevent formation of etching residues during the patterning/etching process of the gate or the source/drain.

The method for fabricating a TFT of this invention is described as follows. A gate is formed on a substrate, and an insulating layer is formed on the substrate covering the gate. A channel layer is formed on the insulating layer above the gate, and then a source/drain is formed on the channel layer to constitute a TFT. In this method, the gate or the source/drain includes a single layer of molybdenum-niobium (MoNb) alloy.

Moreover, in the aforementioned method for fabricating a TFT, the gate may also be formed as a multi-layer structure of MoNb/AlNd or MoNb/AlNd/MoNb, wherein Nd represents neodymium element.

The TFT structure of this invention includes a substrate, a gate, an insulating layer, a channel layer and a source/drain. The gate is disposed on the substrate, the insulating layer is disposed over the substrate covering the gate, and the channel layer is disposed on the insulating layer above the gate. The source/drain is disposed on the channel layer, and the gate or the source/drain includes a single MoNb layer.

Moreover, in the aforementioned TFT structure, the gate can also be constituted of a multi-layer structure of MoNb/AlNd or MoNb/AlNd/MoNb.

In addition, the amount of niobium in the MoNb alloy is less than 10% in the above-mentioned TFT structure and the fabricating method thereof.

Since the TFT process of this invention forms a single MoNb layer instead of the conventional AlNd/Cr or AlNd/Mo composite layer as the material of the gate or source/drain, the fabricating process of the gate or the source/drain can be simplified to improve the throughput.

Moreover, since the MoNb alloy has a lower contact resistance and a lower wire resistance, the contact resistance and the wire resistance of the gate or the source/drain can be lowered.

Furthermore, since the MoNb alloy is highly resistant to oxidation and erosion, no protective mask layer is needed during the etching process. Therefore, no etching residue is produced during the etching process.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

This invention is further explained with an □-Si TFT and the fabricating process thereof as a preferred embodiment. However, the scope of this invention is not restricted to the contents of the preferred embodiment, and this invention can also be applied to the cases of LTPS (Low Temperature Poly-Silicon) TFT.

Figure 1:
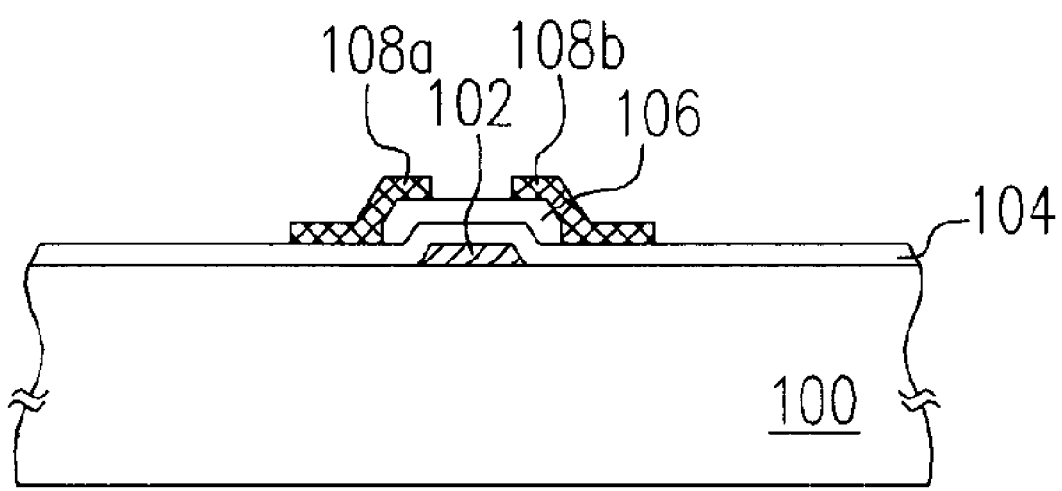
FIG. 1 illustrates a cross-sectional view of a TFT structure according to a preferred embodiment of this invention.

FIG. 1 illustrates a cross-sectional view of a TFT structure according to the preferred embodiment of this invention.

Referring to FIG. 1, a TFT structure of this invention includes a substrate 100, a gate 102, an insulating layer 104, a channel layer 106, a source 108a and a drain 108b. The gate 102 is disposed on the substrate 100, the insulating layer 104 is disposed over the substrate 100 covering the gate 102, and the channel layer 106 is disposed on the insulating layer 104 above the gate 102. The source/drain 108a/b is disposed on the channel layer 106.

The gate 102 is preferably based on a MoNb alloy, wherein the amount of niobium is less than 10%. The gate 102 can be a single MoNb layer, or a composite layer of MoNb/AlNd or MoNb/AlNd/MoNb, while the material of the source/drain 108a/b may be a conventional one like chromium (Cr).

Besides, in another embodiment, the source/drain 108a/b is based on a MoNb alloy, wherein the amount of niobium is less than 10%. The source/drain 108a/b can be a single MoNb layer, or a composite layer of MoNb/AlNd or MoNb/AlNd/MoNb, while the gate 102 can be constituted of a conventional AlNd/Mo composite layer, for example. In still another embodiment, each of the gate 102 and the source/drain 108a/b is based on a MoNb alloy, wherein the amount of niobium is less than 10%. Each of the gate 102 and the source/drain 108a/b can be a single MoNb layer, or a composite layer of MoNb/AlNd or MoNb/AlNd/MoNb.

It is noted that a MoNb alloy is more stable than pure chromium or pure molybdenum used in the prior art, and is therefore more resistant to oxidation and erosion. The resistance to oxidation and erosion of a MoNb alloy can be enhanced by increasing the amount of niobium, but the electrical resistance of the MoNb alloy will be adversely raised with this method. Therefore, the amount of niobium should be moderately adjusted according to the requirements of the product.

Figure 2A:
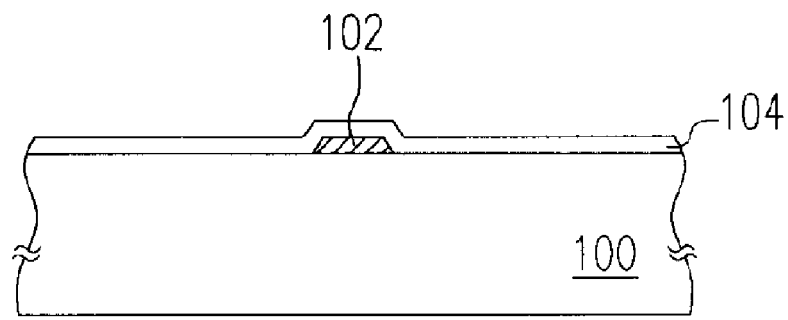
FIGS. 2A–2C illustrate a process flow of fabricating a TFT according to the preferred embodiment of this invention in a cross-sectional view.
Figure 2B:
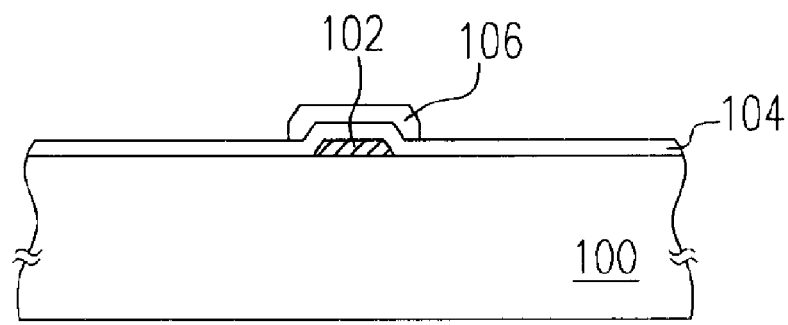
Figure 2C:
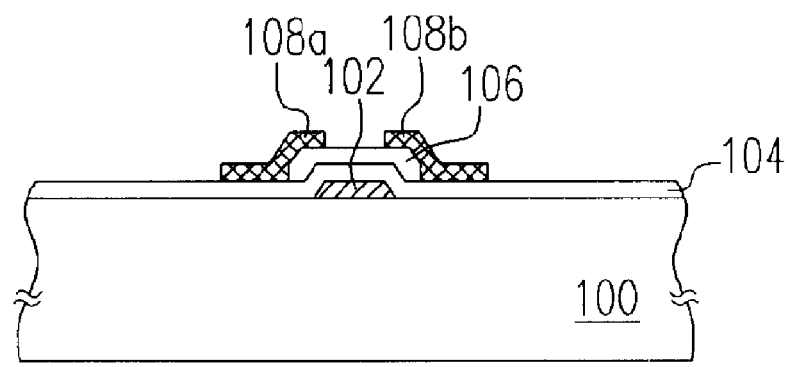

On the other hand, FIGS. 2A–2C illustrate a process flow of fabricating a TFT according to the preferred embodiment of this invention in a cross-sectional view.

Referring to FIG. 2A, a substrate 100, such as a glass substrate or a transparent plastic substrate, is provided. A metal layer (not shown) having a thickness of thousands of angstroms is formed on the substrate 100 and then patterned to form a gate 102. The metal layer can be formed with a sputtering method, and can be a single MoNb layer or a composite layer of MoNb/AlNd or MoNb/AlNd/MoNb, wherein the amount of niobium in the MoNb alloy is less than 10%.

Thereafter, a blanket insulating layer 104 is formed on the substrate 100 covering the gate 102. The insulating layer 104 is, for example, a silicon nitride layer or a silicon oxide layer that is formed with a plasma-enhanced chemical vapor deposition (PECVD) process.

Referring to FIG. 2B, a layer of channel material (not shown) is formed on the insulating layer 104 and then patterned into a channel layer 106 on the insulating layer 104 above the gate 102. The channel layer 106 is formed from □-Si, for example, and can be provided with an ohmic contact layer thereon. The material of the ohmic contact layer is, for example, $n^+$-doped amorphous silicon.

Referring to FIG. 2C, another metal layer (not shown) is formed over the substrate 100 and then patterned to form a source/drain 108a/b using a lithographic process and an etching process. The metal layer can be a single MoNb layer or a composite layer of MoNb/AlNd or MoNb/AlNd/MoNb, wherein the amount of niobium in the MoNb alloy is less than 10%. After the source/drain 108a/b is formed, the etching process is continued for a while to remove move a portion of the exposed channel layer 106. With the above steps, a TFT constituted of a gate 102, an insulating layer 104, a channel layer 106 and a source/drain 108a/b is obtained.

Several tests have been conducted to demonstrate the effects of this invention, wherein the gate or the source/drain includes a single MoNb layer or a composite layer containing a MoNb layer, wherein the amount of niobium in the MoNb layer is less than 10%. The single MoNb layer or the composite layer is formed with a sputtering process conducted with an argon flow rate of 80 sccm and a power of 55 kW under 180° C. The testing results are listed in Tables 1 and 2.

TABLE 1

S/D Resistance

| Material of Source/drain | Sheet resistance ($\Omega/cm^2$) | Contact resistance ($\Omega/cm^2$) |
| --- | --- | --- |
| MoNb alloy (4000 Å) | 18.35 | 1.291 |
| Cr (4000 Å) | 20.09 | 2.814 |
| MoNb (450 Å)/ AlNd (2000 Å)/ MoNb (150 Å) | 10.92 | 1.31 |

As shown in Table 1, the sheet resistance and the contact resistance of a source/drain constituted of a single MoNb layer are lower than those of a conventional chromium source/drain. The contact resistance of a source/drain constituted of a MoNb-containing composite layer is intermediate, and the sheet resistance of the same is lowest. Accordingly, using MoNb as the base material of the source/drain can actually reduce the contact resistance and the wire resistance of the source/drain.

TABLE 2

Gate Resistance

| Material of Gate | Sheet resistance ($\Omega/cm^2$) | Contact resistance ($\Omega/cm^2$) |
| --- | --- | --- |
| MoNb alloy (4000 Å) | 8.118 | 7.487 |
| AlNd alloy (4000 Å) | 5.089 | 675.9 |
| MoNb alloy (450 Å)/ AlNd alloy (2000 Å) | 4.597 | 34.76 |

As shown in Table 2, when the gate is constituted of a single MoNb layer, the sheet resistance of the gate is higher than that of a conventional AlNd gate, but the contact resistance of the former is much lower than that of the latter. Moreover, both the sheet resistance and the contact resistance of the bilayer gate containing a MoNb layer are lower than those of a conventional AlNd gate. Accordingly, using MoNb as the base material of the gate can actually reduce the contact resistance of the same.

As mentioned above, the gate or the source/drain can be constituted of a single MoNb layer or a composite layer of MoNb/AlNd or MoNb/AlNd/MoNb in the above embodiment. However, the gate or the source/drain is preferably constituted of a single MoNb layer, since the MoNb alloy is highly resistant to oxidation and erosion and has a relatively low contact resistance. By doing so, not only the contact resistance of the gate or the source/drain can be reduced, but also the fabricating process of the gate or the source/drain can be simplified.

Since the method of this invention uses a MoNb alloy having a lower contact resistance instead of conventional AlNd/Cr or AlNd/Mo as the base material of the gate or the source/drain, the contact resistance of the gate or the source/drain can be much reduced. Moreover, since the MoNb alloy is more stable, no protective mask layer is needed in the patterning process of the gate or the source/drain.

Moreover, since the gate can be constituted of a single MoNb layer instead of a composite metal layer, the TFT fabricating process can be simplified to increase the throughput.

Furthermore, since no protective mask layer is formed before the etching process of the gate or the source/drain, no etching residue is formed during the etching process.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a thin film transistor (TFT), comprising:
    forming a gate on a substrate, the gate comprising a composite layer of MoNb/AlNd or MoNb/AlNd/MoNb;
    forming an insulating layer over the substrate covering the gate;
    forming a channel layer on the insulating layer above the gate; and
    forming a source/drain on the channel layer.

2. The method of claim 1, wherein an amount of niobium in the MoNb alloy is less than 10%.

3. The method of claim 1, wherein the source/drain comprises a single MoNb layer or a composite layer of MoNb/AlNd or MoNb/AlNd/MoNb.

4. The method of claim 3, wherein an amount of niobium in the MoNb alloy is less than 10%.

5. A method for fabricating a thin film transistor (TFT), comprising:
    forming a gate on a substrate;
    forming an insulating layer over the substrate covering the gate;
    forming a channel layer on the insulating layer above the gate; and
    forming a source/drain on the channel layer, the source/drain comprising a composite layer of MoNb/AlNd or MoNb/AlNd/MoNb.

6. The method of claim 5, wherein an amount of niobium in the MoNb alloy is less than 10%.

7. A thin film transistor (TFT), comprising:
    a gate on a substrate, the gate comprising a composite layer of MoNb/AlNd or MoNb/AlNd/MoNb;
    an insulating layer over the substrate covering the gate;
    a channel layer on the insulating layer above the gate; and
    a source/drain on the channel layer.

8. The TFT of claim 7, wherein an amount of niobium in the MoNb alloy is less than 10%.

9. The TFT of claim 7, wherein the source/drain comprises a single MoNb layer or a composite layer of MoNb/AlNd or MoNb/AlNd/MoNb.

10. The TFT of claim 9, wherein an amount of niobium in the MoNb alloy is less than 10%.

11. A thin film transistor (TFT), comprising:
    a gate on a substrate;
    an insulating layer over the substrate covering the gate;
    a channel layer on the insulating layer above the gate; and
    a source/drain on the channel layer, the source/drain comprising a composite layer of MoNb/AlNd or MoNb/AlNd/MoNb.

12. The method of claim 11, wherein an amount of niobium in the MoNb alloy is less than 10%.

* * * * *